US010840909B2

(12) United States Patent  
Yajima et al.

(10) Patent No.: US 10,840,909 B2  
(45) Date of Patent: Nov. 17, 2020

(54) SIGNAL OUTPUTTING CIRCUIT (71) Applicant: KABUSHIKI KAISHA TOKAI-RIKA-DENKI-SEISAKUSHO, Aichi-ken (JP)

(72) Inventors: Akira Yajima, Aichi-ken (JP); Tomoki Narita, Aichi-ken (JP)

(73) Assignee: KABUSHIKI KAISHA TOKAI-RIKA-DENKI-SEISAKUSHO, Aichi (JP)

( * ) Notice: Subject to any disclaimer, the term of this patent is extended or adjusted under 35 U.S.C. 154(b) by 0 days.

(21) Appl. No.: 16/668,034

(22) Filed: Oct. 30, 2019

(65) Prior Publication Data

US 2020/0145004 A1    May 7, 2020

(30) Foreign Application Priority Data

Nov. 6, 2018    (JP) ................. 2018-209013

(51) Int. Cl.
*H03K 19/0175* (2006.01)
*H03K 19/0185* (2006.01)
*H03L 5/00* (2006.01)

(52) U.S. Cl.
CPC ............... *H03K 19/017509* (2013.01)

(58) Field of Classification Search
CPC ............................... H03K 19/017509
See application file for complete search history.

(56) References Cited

U.S. PATENT DOCUMENTS

| | | | |
|---|---|---|---|
| 6,724,226 B2* | 4/2004 | Kim | G11C 7/1078 326/81 |
| 7,388,410 B2* | 6/2008 | Kim | H03K 3/3565 327/108 |
| 7,551,005 B2* | 6/2009 | Makino | G05F 1/575 327/103 |
| 2018/0212604 A1 | 7/2018 | Matsubara | |

FOREIGN PATENT DOCUMENTS

JP    2018-121324 A    8/2018

* cited by examiner

*Primary Examiner* — Kenneth B Wells  
(74) *Attorney, Agent, or Firm* — Roberts Calderon Safran & Cole P.C.

(57) ABSTRACT

A signal outputting circuit including: an input line to which an input signal is inputted; a first current generating circuit connected to the input line, the first current generating circuit generating a first current having a magnitude corresponding to a level of a supplied power supply voltage; a second current generating circuit connected to the input line, the second current generating circuit generating a second current that turns ON and OFF in accordance with switching of a level of an output signal; a resistor element provided at the input line; and an outputting circuit that switches a logic level of the output signal in accordance with a level of voltage generated at the input line.

6 Claims, 5 Drawing Sheets

SIGNAL OUTPUTTING CIRCUIT

CROSS-REFERENCE TO RELATED APPLICATION

This application claims priority under 35 USC 119 from Japanese Patent Application No. 2018-209013, filed on Nov. 6, 2018, the disclosure of which is incorporated by reference herein.

BACKGROUND

Technical Field

The present disclosure relates to a signal outputting circuit.

Related Art

The following technique is known as a technique according to a signal outputting circuit in which the level of the output signal switches in accordance with switching of the level of the input signal.

For example, Japanese Patent Application Laid-Open (JP-A) No. 2018-121324 discloses a level shifter that includes: a power supply system current source having a first resistor at which one end is connected to a first power supply voltage, and a first transistor at which a first main electrode and a first control electrode are connected to another end of the first resistor, and at which a second main electrode is connected to a second power supply voltage that is a voltage that is lower than the first power supply voltage; a second transistor at which a third main electrode is connected to an input voltage signal terminal, a fourth main electrode is connected to an output voltage signal terminal, and a second control electrode is connected to a third power supply voltage that is a voltage that is lower than the first power supply voltage and higher than the second power supply voltage; a second resistor at which one end is connected between the fourth main electrode and the output voltage signal terminal; and a third transistor at which a fifth main electrode is connected to another end of the second resistor, a sixth main electrode is connected to the second power supply voltage, and a third control electrode is connected to the first control electrode.

A signal outputting circuit, in which the level of the output signal switches in accordance with switching of the level of the input signal, is configured so as to include for example a CMOS inverter at which, in a case in which the level of the input signal reaches a threshold value, the level of the output signal switches. However, in a case in which the threshold value at which the level of the output signal switches is fixed, if noise is superimposed on the input signal, there is the concern that chattering will occur in the output signal. Namely, chattering occurs in the output signal in a situation such as a situation in which the level of the input signal changes in a vicinity of the threshold value.

SUMMARY

The present disclosure provides a signal outputting circuit that may suppress the occurrence of chattering in an output signal.

A first aspect of the present disclosure is a signal outputting circuit including: an input line to which an input signal is inputted; a first current generating circuit connected to the input line, the first current generating circuit generating a first current having a magnitude corresponding to a level of a supplied power supply voltage; a second current generating circuit connected to the input line, the second current generating circuit generating a second current that turns ON and OFF in accordance with switching of a level of an output signal; a resistor element provided at the input line; and an outputting circuit that switches a logic level of the output signal in accordance with a level of voltage generated at the input line.

In accordance with the signal outputting circuit according to the first aspect, since a hysteresis characteristic can be provided between the input signal and the output signal, the occurrence of chattering in the output signal may be suppressed.

The signal outputting circuit may be configured such that, in a case in which a level of the output signal is a first level, current of a magnitude corresponding to a magnitude of the first current flows at the resistor element, and, in a case in which the level of the output signal is a second level that is different than the first level, current, which is a magnitude corresponding to a sum of the magnitude of the first current and a magnitude of the second current, flows at the resistor element. Due thereto, the magnitude of the decrease in the voltage due to the resistor element can be switched in accordance with the switching of the level of the output signal.

In an ON state, the second current generating circuit may generate, as the second current, current of a magnitude corresponding to the level of the power supply voltage. Due thereto, even in a case in which the level of the input signal fluctuates in conjunction with fluctuations in the level of the power supply voltage, the occurrence of malfunctions may be suppressed.

The signal outputting circuit may further include a first transistor that turns ON and OFF in accordance with the output signal. In this case, the second current generating circuit may include a second transistor that is turned ON and OFF in accordance with turning ON and OFF of the first transistor and that outputs the second current.

The outputting circuit may output, as the output signal, a signal of a level that differs from a level of the input signal. Due thereto, it is possible to handle a case in which it is desired to control, on the basis of the input signal, a circuit that includes, for example, an element having a low withstand voltage to which an input signal cannot be inputted directly.

A second aspect of the present disclosure is a signal outputting circuit including: a semiconductor chip including an input terminal to which an input signal is inputted; and a first resistor element connected to the input terminal, wherein the semiconductor chip includes: an input line connected to the input terminal, a first current generating circuit connected to the input line, the first current generating circuit generates a first current having a magnitude corresponding to a level of a supplied power supply voltage, a second current generating circuit connected to the input line, the second current generating circuit generates a second current that turns ON and OFF in accordance with switching of a level of an output signal, a second resistor element provided at the input line and is connected in series to the first resistor element, and an outputting circuit that switches a logic level of the output signal in accordance with a level of voltage generated at the input line.

In accordance with the signal outputting circuit according to the second aspect, since a hysteresis characteristic can be provided between the input signal and the output signal, the occurrence of chattering in the output signal may be suppressed. Further, since the hysteresis width can be adjusted by the resistance value of the first resistor element, adjustment of the hysteresis width may be carried out flexibly.

In accordance with the above-described aspects, the signal outputting circuit of the present disclosure may suppress the occurrence of chattering in an output signal.

BRIEF DESCRIPTION OF THE DRAWINGS

Exemplary embodiments will be described in detail based on the following figures, wherein.

DETAILED DESCRIPTION

Exemplary embodiments of the present disclosure are described hereinafter with reference to the drawings. Note that, in the drawings, structural elements and portions that are substantially the same or are equivalent are denoted by the same reference numerals.

First Exemplary Embodiment

Figure 1:
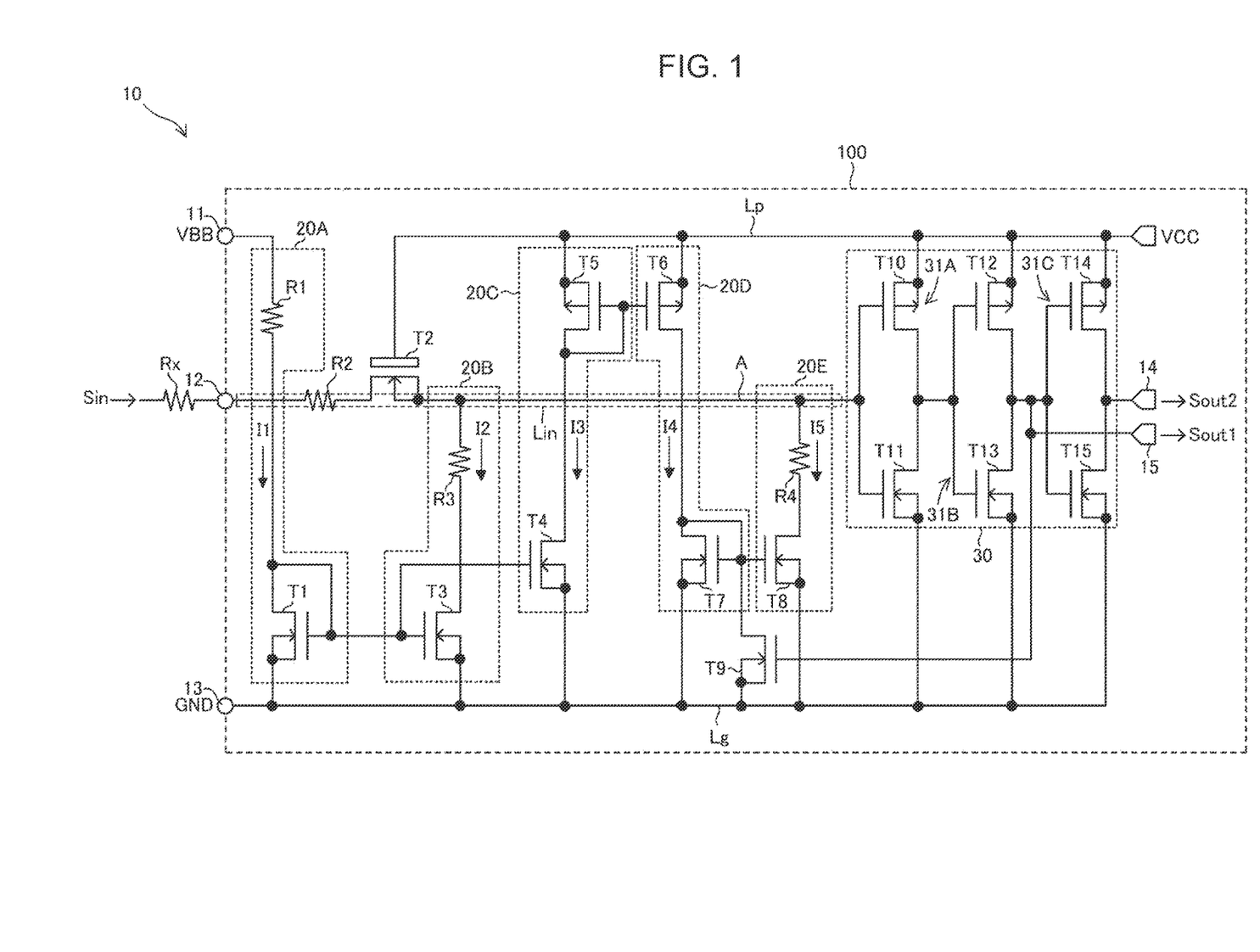
FIG. 1 is a drawing showing the structure of a signal outputting circuit according to an exemplary embodiment of the present disclosure.

FIG. 1 is a drawing showing an example of the structure of a signal outputting circuit 10 according to a first exemplary embodiment of the present disclosure. In the present exemplary embodiment, the signal outputting circuit 10 is configured as a semiconductor integrated circuit that is formed within a single semiconductor chip 100. Note that an external resistor element Rx that is provided as an option is shown together with the semiconductor chip 100 in FIG. 1. However, in the first exemplary embodiment, description is given of a case in which the external resistor element Rx is not included. A case in which the external resistor element Rx is included is explained in the second exemplary embodiment that is described later.

The semiconductor chip 100 that structures the signal outputting circuit 10 has an input terminal 12 to which input signal Sin is inputted, a power supply terminal 11 to which power supply voltage VBB is supplied, and a ground terminal 13 to which ground potential GND is supplied. Note that the power supply voltage VBB that is inputted to the power supply terminal 11 is 8V to 18 V for example. The input terminal 12, the power supply terminal 11 and the ground terminal 13 may formed as external terminals that can be accessed from the exterior of the semiconductor chip 100, such as, for example, electrode pads or bumps or the like. The signal outputting circuit 10 incldues input line Lin, current generating circuits 20A, 20B, 20C, 20D, 20E and an outputting circuit 30.

The input line Lin is connected to the input terminal 12, and the input signal Sin is inputted to the input line Lin via the input terminal 12. Note that FIG. 1 illustrates a situation in which the input signal Sin is inputted to the input terminal 12 via the external resistor element Rx, but, in the present exemplary embodiment, the input signal Sin is inputted directly to the input terminal 12 without going through the external resistor element Rx. The input signal Sin is a signal that exhibits a high level that corresponds to the voltage level of the power supply voltage VBB, and a low level that corresponds to ground level. A resistor element R2 and a transistor T2 are provided on the input line Lin.

One end of the resistor element R2 is connected to the input terminal 12, and the other end is connected to the drain of the transistor T2. The source of the transistor T2 is connected to the gate (node A) of a C-MOS inverter 31A that structures the outputting circuit 30, and the gate of the transistor T2 is connected to power supply line Lp that is within the semiconductor chip 100. In-chip power supply voltage VCC of 5 V for example is supplied to the power supply line Lp.

The transistor T2 is configured by an n-channel VDMOSFET (Vertical Diffused Metal Oxide Semiconductor Field Effect Transistor). The electrostatic breakdown resistance of the transistor T2 is high as compared with other transistors T1 and T3 through T15 that structure the signal outputting circuit 10. The transistor T2 functions as a surge protecting element that protects the transistors T1 and T3 through T15 from surges such as ESD (electrostatic discharge) and the like that are applied to the input line Lin. Note that the transistor T2 may be omitted in cases in which resistance to surges applied to the input terminal 12 can be ensured. The transistors T1 and T3 through T15 that are other than the transistor T2 are configured by usual MOSFETs.

The current generating circuit 20A includes a resistor element R1 and the n-channel transistor T1. One end of the resistor element R1 is connected to the power supply terminal 11. The drain and the gate of the transistor T1 are connected to another end of the resistor element R1, and the source of the transistor T1 is connected to ground line Lg. The current generating circuit 20A generates current I1 of a magnitude that corresponds to the level of the power supply voltage VBB that is supplied from the exterior of the semiconductor chip 100. Concretely, the higher the level of the power supply voltage VBB, the greater the magnitude of the current I1.

The current generating circuit 20B includes the n-channel transistor T3 and a resistor element R3. The drain of the transistor T3 is connected to one end of the resistor element R3, the gate of the transistor T3 is connected to the gate of the transistor T1, and the source of the transistor T3 is connected to the ground line Lg. The transistor T3, together with the transistor T1, structures a current mirror circuit. The other end of the resistor element R3 is connected to the node A of the input line Lin. The current generating circuit 20B generates current I2 of a magnitude that is proportional to the magnitude of the current I1 generated by the current generating circuit 20A. Namely, the magnitude of the current I2 is a magnitude that corresponds to the level of the power supply voltage VBB. Concretely, the higher the level of the power supply voltage VBB, the greater the magnitude of the current I2. The ratio (mirror ratio) of the current I2 to the current I1 can be adjusted by, for example, the surface area ratio (the cell number ratio) of the transistors T1 and T3, or the like. Note that the current generating circuit 20B is an example of the first current generating circuit in the present disclosure.

The current generating circuit 20C includes the n-channel transistor T4 and the p-channel transistor T5. The gate of the transistor T4 is connected to the gates of the transistors T1, T3, the drain of the transistor T4 is connected to the drain of the transistor T5, and the source of the transistor T4 is connected to the ground line Lg. The transistor T4, together with the transistor T1, structures a current mirror circuit. The source of the transistor T5 is connected to the power supply line Lp, and the gate and the drain of the transistor T5 are connected to the drain of the transistor T4. The current generating circuit 20C generates current I3 of a magnitude that is proportional to the magnitude of the current I1 generated by the current generating circuit 20A. Namely, the magnitude of the current I3 is a magnitude corresponding to the level of the power supply voltage VBB. Concretely, the higher the level of the power supply voltage VBB, the greater the magnitude of the current I3. The ratio (mirror ratio) of the current I3 to the current I1 can be adjusted by, for example, the surface area ratio (the cell number ratio) of the transistors T1 and T4, or the like.

The current generating circuit 20D includes the p-channel transistor T6 and the n-channel transistor T7. The source of the transistor T6 is connected to the power supply line Lp, the gate of the transistor T6 is connected to the gate of the transistor T5, and the drain of the transistor T6 is connected to the drain of the transistor T7. The transistor T6, together with the transistor T5, structures a current mirror circuit. The drain and the gate of the transistor T7 are connected to the drain of the transistor T6, and the source of the transistor T7 is connected to the ground line Lg. The current generating circuit 20D generates current I4 of a magnitude that is proportional to the magnitude of the current I3 generated by the current generating circuit 20C. Namely, the magnitude of the current I4 is a magnitude corresponding to the level of the power supply voltage VBB. Concretely, the higher the level of the power supply voltage VBB, the greater the magnitude of the current I4. The ratio (mirror ratio) of the current I4 to the current I3 can be adjusted by, for example, the surface area ratio (the cell number ratio) of the transistors T5 and T6, or the like.

The current generating circuit 20E includes the n-channel transistor T8 and a resistor element R4. The drain of the transistor T8 is connected to one end of the resistor element R4, the gate of the transistor T8 is connected to the gate of the transistor T7, and the source of the transistor T8 is connected to the ground line Lg. The transistor T8, together with the transistor T7, structures a current mirror circuit. The another end of the resistor element R4 is connected to the node A of the input line Lin. The switching ON and OFF of the current generating circuit 20E is controlled by the transistor T9.

The drain of the transistor T9 is connected to the respective gates of the transistors T7, T8, and the source of the transistor T9 is connected to the ground line Lg, and the gate of the transistor T9 is connected to the output end of a C-MOS inverter 31B that structures the outputting circuit 30. Namely, output signal Sout1 that is outputted from the output end of the C-MOS inverter 31B is inputted to the gate of the transistor T9. The transistor T9 turns ON and OFF in accordance with the output signal Sout1. Due to the transistor T9 entering into an OFF state, the transistor T8 enters into an ON state, and the current I5 flows at the current generating circuit 20E (the ON state of the current generating circuit 20E). On the other hand, due to the transistor T9 entering into an ON state, the transistor T8 enters into an OFF state, and the current I5 does not flow at the current generating circuit 20E (the OFF state of the current generating circuit 20E).

In the ON state of the current generating circuit 20E, the current generating circuit 20E generates the current I5 that is of a magnitude proportional to the magnitude of the current I4 generated by the current generating circuit 20D. Namely, the magnitude of the current I5 is a magnitude that corresponds to the level of the power supply voltage VBB. Concretely, the higher the level of the power supply voltage VBB, the greater the magnitude of the current I5. The ratio (mirror ratio) of the current I5 to the current I4 can be adjusted by, for example, the surface area ratio (the cell number ratio) of the transistors T7 and T8, or the like. Note that the current generating circuit 20E is an example of the second current generating circuit in the present disclosure.

The outputting circuit 30 outputs output signals Sout1, Sout2 of logic levels corresponding to the logic level of the input signal Sin. The outputting circuit 30 switches the logic levels of the output signals Sout1, Sout2 in accordance with the level of the voltage generated at the node A of the input line Lin. Namely, in a case in which the level of the voltage that is generated at the node A of the input line Lin exceeds a threshold value, the output signal Sout1 becomes high level, and the output signal Sout2 becomes low level. In a case in which the level of the voltage generated at the node A of the input line Lin falls below the threshold value, the output signal Sout1 becomes low level, and the output signal Sout2 becomes high level.

The outputting circuit 30 includes three C-MOS inverters 31A, 31B, 31C that are dependently connected. The C-MOS inverter 31A includes the p-channel transistor T10 and the n-channel transistor T11. The source of the transistor T10 is connected to the power supply line Lp, the drain of the transistor T10 is connected to the drain of the transistor T11, and the gate of the transistor T10 is connected to the node A of the input line Lin. The source of the transistor T11 is connected to the ground line Lg, and the gate of the transistor T11 is connected to the node A of the input line Lin. The gates of the transistors T10, T11 are the input end of the C-MOS inverter 31A, and the drains of the transistors T10, T11 are the output end of the C-MOS inverter 31A.

The C-MOS inverter 31B includes the p-channel transistor T12 and the n-channel transistor T13. The source of the transistor T12 is connected to the power supply line Lp, the drain of the transistor T12 is connected to the drain of the transistor T13, and the gate of the transistor T12 is connected to the output end of the C-MOS inverter 31A which is the previous stage. The source of the transistor T13 is connected to the ground line Lg, and the gate of the transistor T13 is connected to the output end of the C-MOS inverter 31A that is the previous stage. The gates of the transistors T12, T13 are the input end of the C-MOS inverter 31B, and the drains of the transistors T12, T13 are the output end of the C-MOS inverter 31B.

The C-MOS inverter 31C includes the p-channel transistor T14 and the n-channel transistor T15. The source of the transistor T14 is connected to the power supply line Lp, the drain of the transistor T14 is connected to the drain of the transistor T15, and the gate of the transistor T14 is connected to the output end of the C-MOS inverter 31B that is the previous stage. The source of the transistor T15 is connected to the ground line Lg, and the gate of the transistor T15 is connected to the output end of the C-MOS inverter 31B that is the previous stage. The gates of the transistors T14, T15 are the input end of the C-MOS inverter 31C, and the drains of the transistors T14, T15 are the output end of the C-MOS inverter 31C. The C-MOS inverters 31A, 31B, 31C respectively output, from the output ends thereof, signals in which the logics of the signals inputted to the input ends thereof have been inverted.

The output signal Sout1 that is outputted from the output end of the C-MOS inverter 31B, and the output signal Sout2 that is outputted from the output end of the C-MOS inverter 31C, are outputted from output terminals 14, 15 of the outputting circuit 30, respectively. The logics of the output signals Sout1 and Sout2 are inverted with respect to one another. The outputting circuit 30 outputs, as the output signals Sout1 and Sout2, signals in which the level of the input signal Sin, that has a level corresponding to the level (e.g., 8 V to 18 V) of the power supply voltage VBB, is shifted to a level corresponding to the level (e.g., 5 V) of the in-chip power supply voltage VCC.

Operation of the signal outputting circuit 10 is described hereinafter. The input signal Sin that is inputted to the input terminal 12 is inputted via the input line Lin to the input end of the C-MOS inverter 31A that structures the outputting circuit 30. The outputting circuit 30 outputs the output signals Sout1, Sout2 whose logics correspond to the logic of the input signal Sin. For example, in a case in which the input signal Sin is high level, the output signal Sout1 is high level, and the output signal Sout2 is low level. Further, the outputting circuit 30 outputs, as the output signals Sout1 and Sout2, signals in which the level of the input signal Sin, that has a level corresponding to the level (e.g., 8 V to 18 V) of the power supply voltage VBB, has been shifted to a level corresponding to the level (e.g., 5 V) of the in-chip power supply voltage VCC.

The outputting circuit 30 switches the logic levels of the output signals Sout1, Sout2 in accordance with the level of the voltage that is generated at the node A of the input line Lin. Namely, if the level of the voltage that is generated at the node A of the input line Lin exceeds a threshold value, the output signal Sout1 is high level, and the output signal Sout2 is low level. If the level of the voltage that is generated at the node A of the input line Lin is lower than the threshold value, the output signal Sout1 is low level, and the output signal Sout2 is high level.

Figure 2:
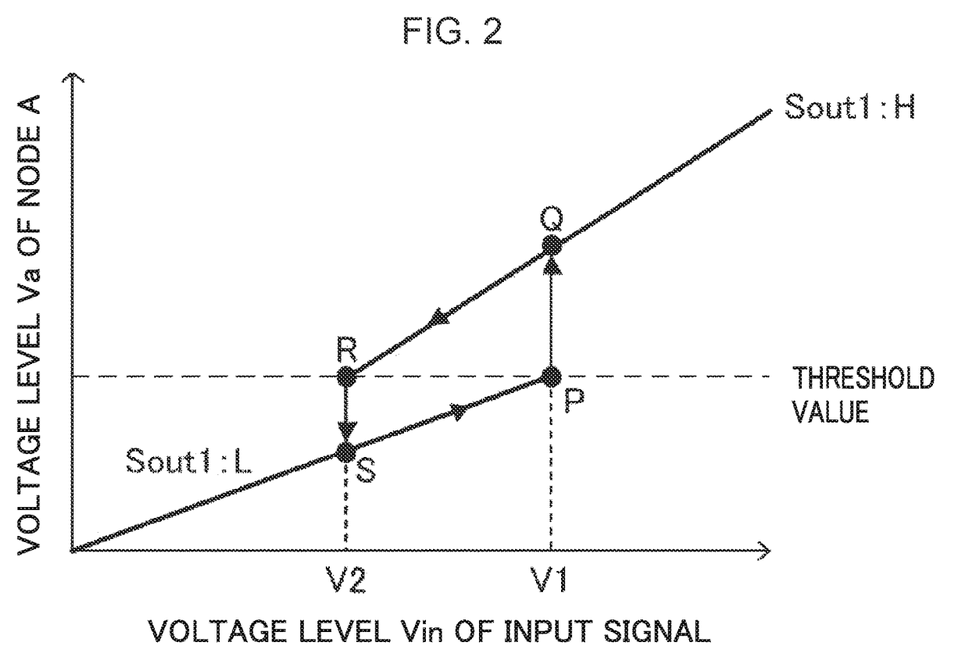
FIG. 2 is a graph showing the relationship between the voltage level of an input signal and the level of voltage that is generated at an input line.

FIG. 2 is a graph showing the relationship between voltage level Vin of the input signal Sin and level Va of the voltage that is generated at the node A of the input line Lin. Of the two lines shown in FIG. 2, the line at the lower side corresponds to a case in which the output signal Sout1 is low level, and the line at the upper side corresponds to a case in which the output signal Sout1 is high level.

Here, given that the input signal Sin is directly inputted to the input terminal 12 without going through the external resistor element Rx, and that the resistance value of the resistor element R2 is r2 and the current that flows at the resistor element R2 is Ir, the level Va of the voltage that is generated at the node A of the input line Lin can be expressed by following formula (1). Namely, the level Va of the voltage that is generated at the node A of the input line Lin corresponds to a level that is the voltage level Vin of the input signal Sin lowered by the resistor element R2.

$$Va = Vin - Ir \times r2 \quad (1)$$

In a case in which the output signal Sout1 is low level, the transistor T7 and the transistor T8 enter into ON states because the transistor T2 enters into an OFF state. As a result, the current generating circuit 20E that is connected to the input line Lin enters into an ON state, and current I5 flows. On the other hand, the current I2 flows also at the current generating circuit 20B that is connected to the input line Lin. Accordingly, in a case in which the output signal Sout1 is low level, the current Ir that flows at the resistor element R2 can be expressed by the following formula (2).

$$Ir = I2 + I5 \quad (2)$$

From formula (1) and formula (2), the level Va of the voltage that is generated at the node A in a case in which the output signal Sout1 is low level can be expressed by following formula (3).

$$Va = Vin - (I2 + I5) \times r2 \quad (3)$$

If the voltage level Va that is expressed by formula (3) exceeds the threshold value of the C-MOS inverter 31A, the output signal Sout1 transitions from low level to high level. The voltage level of the input signal Sin at this time is V1. Due to the output signal Sout1 becoming high level, the operation point of the signal outputting circuit 10 transitions from operation point P to operation point Q.

In a case in which the output signal Sout1 is high level, the transistors T7 and T8 enters into OFF states because the transistor T9 enters into an ON state. As a result, the current generating circuit 20E that is connected to the input line Lin enters into an OFF state, and the current I5 does not flow. On the other hand, the current I2 flows at the current generating circuit 20B that is connected to the input line Lin. Accordingly, in a case in which the output signal Sout1 is high level, the current Ir that flows at the resistor element R2 can be expressed by following formula (4).

$$Ir = I2 \quad (4)$$

From formula (1) and formula (4), the level Va of the voltage that is generated at the node A in a case in which the output signal Sout1 is high level can be expressed by the following formula (5).

$$Va = Vin - I2 \times r2 \quad (5)$$

If the voltage level Va that is expressed by formula (5) becomes lower than the threshold value of the C-MOS inverter 31A, the output signal Sout1 transitions from high level to low level. The voltage level Vin of the input signal Sin at this time is V2 (<V1). Due to the output signal Sout1 becoming low level, the operation point of the signal outputting circuit 10 transitions from operation point R to operation point S.

In this way, in accordance with the signal outputting circuit 10 according to the present exemplary embodiment, in a case in which the output signal Sout1 is low level, the current generating circuit 20E that is connected to the input line Lin enters into an ON state, and the decrease in voltage at the resistor element R2 is relatively large. Further, in a case in which the output signal Sout1 is high level, the current generating circuit 20E that is connected to the input line Lin enters into an OFF state, and the decrease in voltage at the resistor element R2 is relatively small. Due thereto, as shown in FIG. 2, the level Va of the voltage that is generated at the node A of the input line Lin can be made to transition in accordance with the reversal of the logic level of the output signal Sout1. As a result, a hysteresis characteristic can be provided between the input signal Sin and the output signal Sout1 (Sout2). What is called "hysteresis characteristic" here means the characteristic that the voltage level V1 of the input signal at which the output signal Sout1 transitions from low level to high level, and the voltage level V2 of the input signal at which the output signal Sout1 transitions from high level to low level, differ from one another. The difference between V1 and V2 is called the hysteresis width.

Figure 3A:
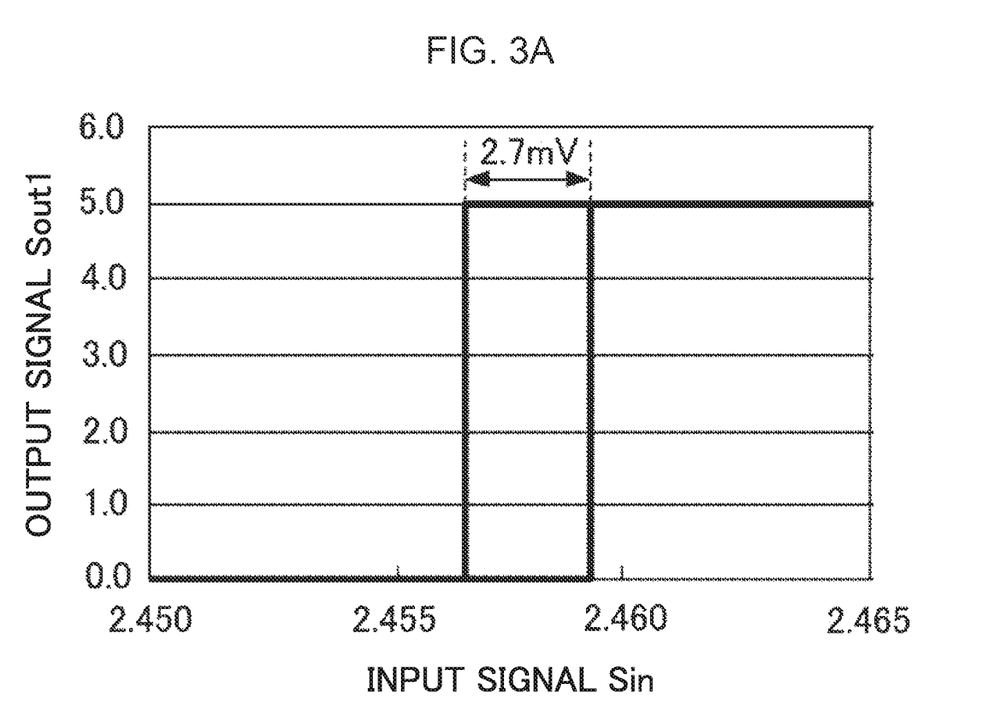
FIG. 3A is a graph showing the relationship between the input signal and an output signal at the signal outputting circuit.

FIG. 3A is a graph showing the relationship between the input signal Sin and the output signal Sout1 at the signal outputting circuit 10. In accordance with the signal outputting circuit 10 according to the present exemplary embodiment, a hysteresis characteristic of a hysteresis width of around 2.7 mV can be realized. By imparting a hysteresis characteristic between the input signal Sin and the output signal Sout1 (Sout2) in this way, the occurrence of chattering in the output signal Sout1 (Sout2) can be suppressed effectively.

Further, in accordance with the signal outputting circuit 10, as shown in FIG. 1, due to the external resistor element Rx being connected to the input terminal 12, and the input signal Sin being inputted via the external resistor element Rx, the hysteresis width can be increased as compared with a case in which the external resistor element Rx is not connected. Namely, in accordance with the signal outputting circuit 10, the hysteresis width can be adjusted by the external resistor element Rx. Accordingly, the hysteresis width of the semiconductor chip 100 unit may be relatively small, and the desired hysteresis width can be obtained by the external resistor element Rx. Because a relatively small hysteresis width at the semiconductor chip 100 unit is permitted, a relatively high process capability can be ensured even in cases in which the range of the specification of the input threshold value voltage at the semiconductor chip 100 unit (the level of the input signal Sin which is the inverted logic of the output signal Sout1 (Sout2)) is relatively narrow.

Further, in accordance with the signal outputting circuit 10, the currents I2 and I5 that affect the magnitude of the decrease in voltage at the resistor element R2 respectively are dependent on the level of the power supply voltage VBB. Due thereto, the magnitude of the decrease in voltage at the resistor element R2 can be changed so as to follow the fluctuations in the level of the power supply voltage VBB. For example, in a case in which the level of the power supply voltage VBB falls from the reference value, the currents I2 and I5 respectively become smaller than the reference value. As a result, the magnitude of the decrease in voltage at the resistor element R2 becomes smaller than the reference value. Due to the magnitude of the decrease in voltage at the resistor element R2 changing so as to follow fluctuations in the level of the power supply voltage VBB in this way, the occurrence of malfunctions with respect to the input signal Sin, whose level fluctuates in conjunction with fluctuations in the level of the power supply voltage VBB, can be suppressed. For example, even in a case in which the input signal Sin, whose level has decreased in conjunction with a decrease in the level of the power supply voltage VBB, is inputted, the voltage lowering operation at the resistor element is suppressed in accordance with the decrease in the level of the power supply voltage VBB. Therefore, detection of the logic level of the input signal Sin can be carried out appropriately, and accordingly, the risk that the output signal Sout1, Sout2 of the wrong logic level will be outputted is suppressed.

Further, in accordance with the signal outputting circuit 10, the current generating circuit 20A and the current generating circuit 20E are connected via multiple current mirror circuits. Therefore, it is easy to enlarge of the range of adjustment of the current I5 that is generated by the current generating circuit 20E, and, as a result, it is easy to enlarge the range of adjustment of the hysteresis width of the hysteresis characteristic.

Note that the present exemplary embodiment describes, as an example, a case in which the outputting circuit 30 includes the three C-MOS inverters 31A, 31B, 31C, but the number of C-MOS inverters can be changed appropriately.

Further, the present exemplary embodiment describes, as an example, a case in which signals, in which the level of the input signal Sin is shifted to a level corresponding to the level (e.g., 5 V) of the in-chip power supply voltage VCC, are outputted as the output signals Sout1 and Sout2. However, the output signals Sout1 and Sout2 that have levels corresponding to the level of the power supply voltage VBB may be outputted. Namely, the signal outputting circuit 10 does not have to have a level shifting function.

Second Exemplary Embodiment

The signal outputting circuit 10 according to the second exemplary embodiment of the present disclosure includes the semiconductor chip 100, and the external resistor element Rx that is connected to the input terminal 12 of the semiconductor chip 100, as shown in FIG. 1. The input signal Sin is inputted via the external resistor element Rx.

In the signal outputting circuit 10 according to the second exemplary embodiment, the level Va of the voltage generated at the node A of the input line Lin corresponds to a level that is the voltage level Vin of the input signal Sin lowered by the resistor element R2 and the external resistor element Rx. Namely, in the signal outputting circuit 10 according to the second exemplary embodiment, the level Va of the voltage generated at the node A in a case in which the output signal Sout1 is low level, can be expressed by following formula (6). Further, in the signal outputting circuit 10, the level Va of the voltage generated at the node A in a case in which the output signal Sout1 is high level can be expressed by following formula (7). Note that, in formula (6) and formula (7), rx is the resistance value of the external resistor element Rx.

$$Va=Vin-(I2+I5)\times(rx+r2) \quad (6)$$

$$Va=Vin-I2\times(rx+r2) \quad (7)$$

In accordance with the signal outputting circuit 10 according to the second exemplary embodiment, the difference in the voltage level Va of the node A of the input line Lin in a case in which the output signal Sout1 is low level and a case in which the output signal Sout1 is high level is great as compared with the signal outputting circuit 10 according to the first exemplary embodiment to which the external resistor element Rx is not connected. Accordingly, the hysteresis width can be made to be large as compared with the signal outputting circuit 10 according to the first exemplary embodiment.

Figure 3B:
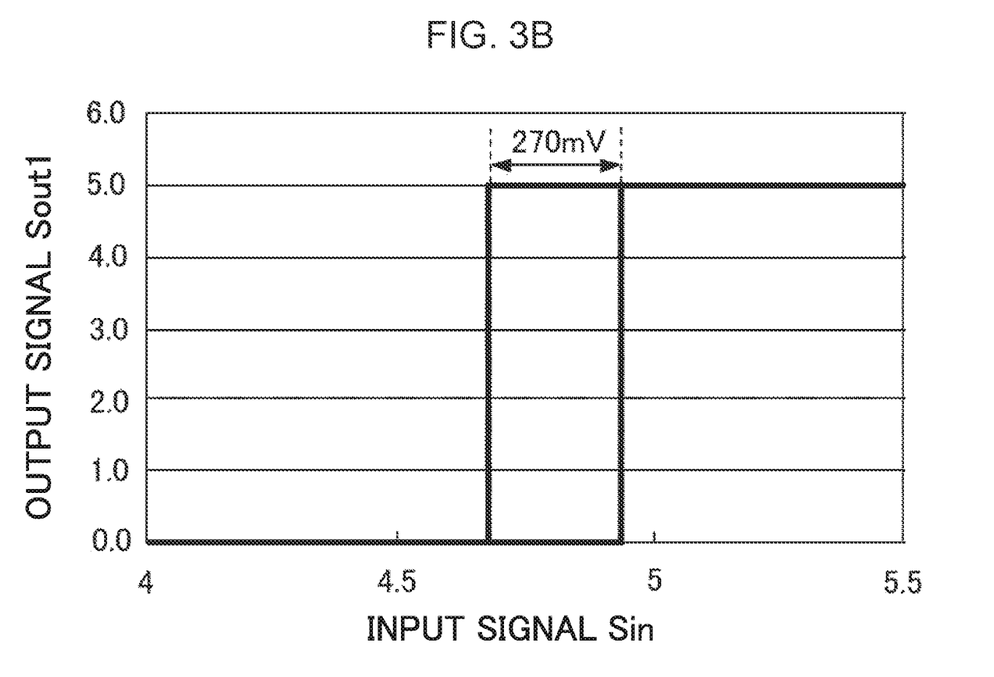
FIG. 3B is a graph showing the relationship between the input signal and the output signal at the signal outputting circuit.

FIG. 3B is a graph showing the relationship between the input signal Sin and the output signal Sout1 at the signal outputting circuit 10 according to the second exemplary embodiment. In accordance with the signal outputting circuit 10 according to the second exemplary embodiment, a hysteresis characteristic of a hysteresis width of around 270 mV can be realized. By imparting a hysteresis characteristic between the input signal Sin and the output signal Sout1 (Sout2) in this way, the occurrence of chattering in the output signal Sout1 (Sout2) can be suppressed.

As described above, in accordance with the signal outputting circuit 10 according to the second exemplary embodiment of the present disclosure, the hysteresis width can be adjusted by the external resistor element Rx that is connected to the input terminal 12 of the semiconductor chip 100. Accordingly, the hysteresis width of the semiconductor chip 100 unit may be small, and the desired hysteresis width may be obtained by the external resistor element Rx.

Third Exemplary Embodiment

Figure 4:
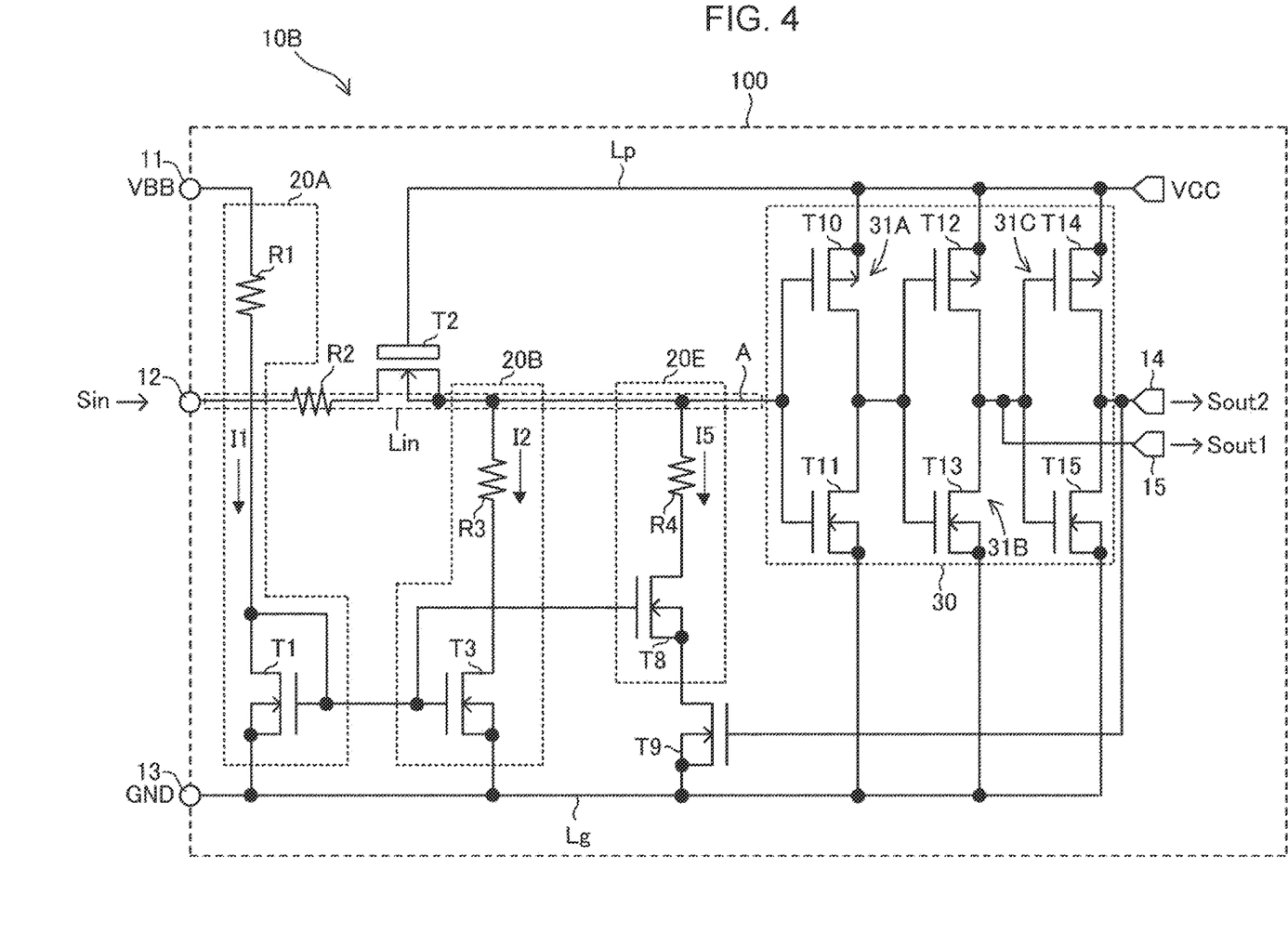
FIG. 4 is a drawing showing the structure of a signal outputting circuit according to an exemplary embodiment of the present disclosure.

FIG. 4 is a drawing showing an example of the structure of a signal outputting circuit 10B according to a third exemplary embodiment of the present disclosure. The signal outputting circuit 10B does not have the current generating circuits 20C and 20D that the signal outputting circuit 10 (see FIG. 1) according to the first exemplary embodiment has. Further, the connecting of the transistors T8 and T9 is different than in the signal outputting circuit 10 according to the first exemplary embodiment.

In the signal outputting circuit 10B, the current generating circuit 20E includes the resistor element R4 and the n-channel transistor T8. The drain of the transistor T8 is connected to one end of the resistor element R4, the gate of the transistor T8 is connected to the gates of the transistors T1 and T3, and the source of the transistor T8 is connected to the drain of the transistor T9. The transistor T8, together with the transistor T1, structures a current mirror circuit. The other end of the resistor element R4 is connected to the node A of the input line Lin.

The drain of the transistor T9 is connected to the source of the transistor T8, the source of the transistor T9 is connected to the ground line Lg, and the gate of the transistor T9 is connected to the output end of the C-MOS inverter 31C (the drains of the transistors T14 and T15). Namely, the output signal Sout2, which is outputted from the output end of the C-MOS inverters 31C, is inputted to the gate of the transistor T9. The transistor T9 turns ON and OFF in accordance with the output signal Sout2. Note that the gate of the transistor T9 may be connected to the output end of the C-MOS inverters 31A (the drains of the transistors T10 and T11). Due to the transistor T9 entering into an OFF state, the current path is cut-off, and the current I5 does not flow at the current generating circuit 20E (the OFF state of the current generating circuit 20E). On the other hand, due to the transistor T9 entering into an ON state, the current path becomes conductive, and the current I5 flows at the current generating circuit 20E (the ON state of the current generating circuit 20E).

In the ON state of the current generating circuit 20E, the current generating circuit 20E generates the current I5 that is a magnitude that is proportional to the magnitude of the current I1 that is generated by the current generating circuit 20A. Namely, the magnitude of the current I5 is a magnitude that corresponds to the level of the power supply voltage VBB. Concretely, the higher the level of the power supply voltage VBB, the greater the magnitude of the current I5. The ratio (mirror ratio) of the current I5 to the current I1 can be adjusted by, for example, the surface area ratio (the cell number ratio) of the transistors T1 and T8, or the like.

In accordance with the signal outputting circuit 10B according to the third exemplary embodiment of the present disclosure, effects that are similar to those of the signal outputting circuit 10 according to the first exemplary embodiment can be obtained. Further, because the circuit scale can be reduced as compared with the signal outputting circuit 10 according to the first exemplary embodiment, the manufacturing cost can be reduced. Note that the external resistor element Rx may be connected to the input terminal 12 of the semiconductor chip 100 at which the signal outputting circuit 10B is formed.

Fourth Exemplary Embodiment

Figure 5:
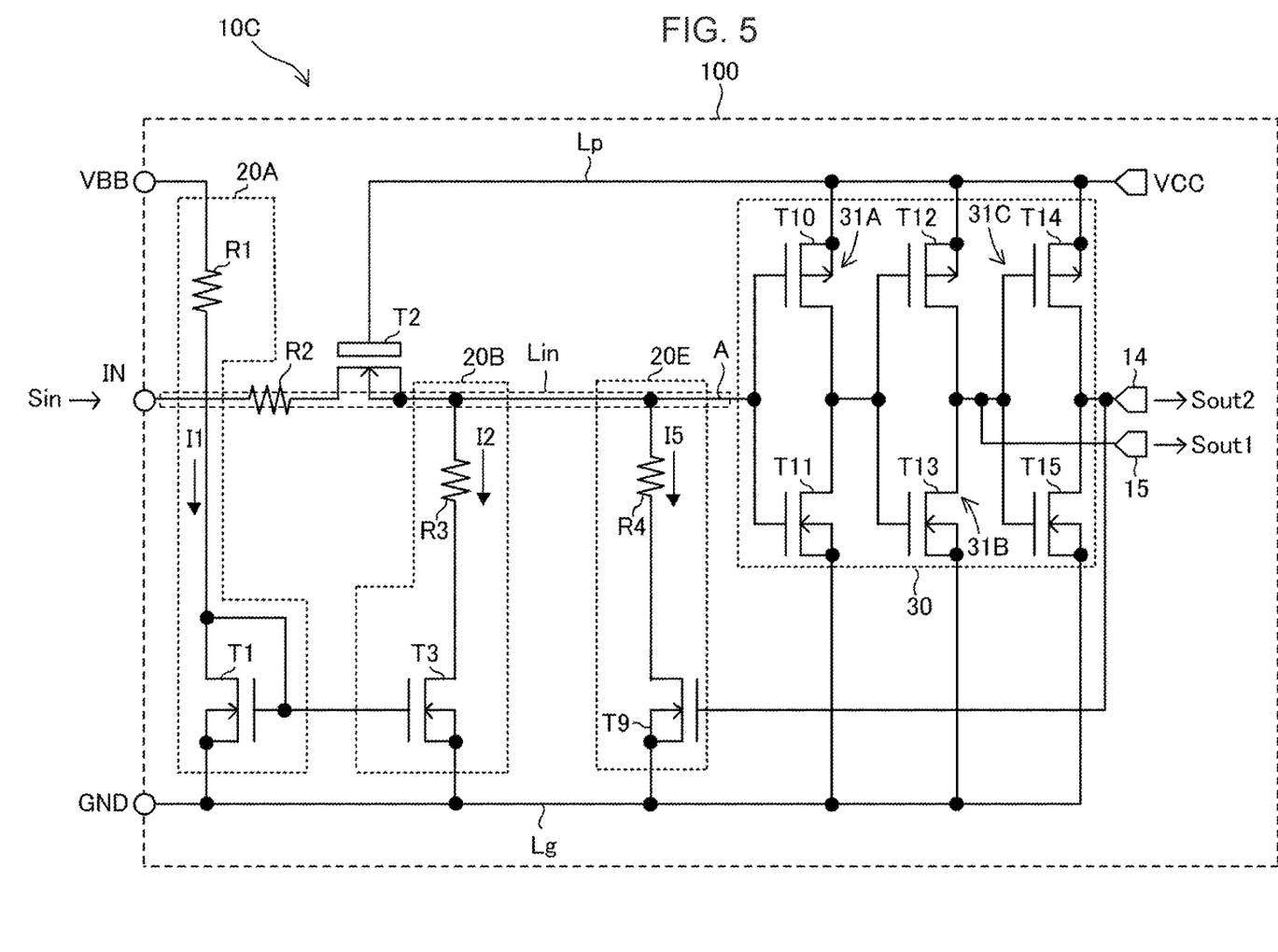
FIG. 5 is a drawing showing the structure of a signal outputting circuit according to an exemplary embodiment of the present disclosure.

FIG. 5 is a drawing showing an example of the structure of a signal outputting circuit 10C according to a fourth exemplary embodiment of the present disclosure. The signal outputting circuit 10C does not have the current generating circuits 20C and 20D that the signal outputting circuit 10 (see FIG. 1) according to the first exemplary embodiment has. Further, the structure of the current generating circuit 20E differs from that in the signal outputting circuit 10 according to the first exemplary embodiment.

In the signal outputting circuit 10C, the current generating circuit 20E includes the resistor element R4 and the n-channel transistor T9. The drain of the transistor T9 is connected to one end of the resistor element R4, the source of the transistor T9 is connected to the ground line Lg, and the gate of the transistor T9 is connected to the output end of the C-MOS inverter 31C (the drains of the transistors T14 and T15). Namely, the output signal Sout2, which is outputted from the output end of the C-MOS inverter 31C, is inputted to the gate of the transistor T9. The transistor T9 turns ON and OFF in accordance with the output signal Sout2. Note that the gate of the transistor T9 may be connected to the output end of the C-MOS inverter 31A (the drains of the transistors T10 and T11). The other end of the resistor element R4 is connected to the node A of the input line Lin.

Due to the transistor T9 entering into an OFF state, the current path is cut-off, and the current I5 does not flow at the current generating circuit 20E (the OFF state of the current generating circuit 20E). On the other hand, due to the transistor T9 entering into an ON state, the current path becomes conductive, and the current I5 flows at the current generating circuit 20E (the ON state of the current generating circuit 20E).

In accordance with the signal outputting circuit 10C according to the fourth exemplary embodiment of the present disclosure, effects that are similar to those of the signal outputting circuit according to the first exemplary embodiment can be obtained. In the signal outputting circuit 10C according to the fourth exemplary embodiment of the present disclosure, although the current I5 does not depend on the level of the power supply voltage VBB, the circuit scale can be made to be small as compared with the signal outputting circuit 10 according to the first exemplary embodiment, and therefore, the manufacturing cost can be reduced. Note that the external resistor element Rx may be connected to the input terminal 12 of the semiconductor chip 100 at which the signal outputting circuit 10C is formed.

What is claimed is:

1. A signal outputting circuit comprising:
   an input line to which an input signal is inputted;
   a first current generating circuit connected to the input line, the first current generating circuit generating, from the input line, a first current having a magnitude corresponding to a level of a supplied power supply voltage;
   a second current generating circuit connected to the input line, the second current generating circuit generating, from the input line, a second current that turns ON and OFF in accordance with switching of a level of an output signal;
   a resistor element connected to the input line; and
   an outputting circuit that switches a logic level of the output signal in accordance with a level of voltage of the input line.

2. The signal outputting circuit of claim 1, wherein:
   in a case in which a level of the output signal is a first level, current of a magnitude corresponding to a magnitude of the first current flows through the resistor element, and in a case in which the level of the output signal is a second level that is different than the first level, current, which is a magnitude corresponding to a sum of the magnitude of the first current and a magnitude of the second current, flows through the resistor element.

3. The signal outputting circuit of claim 1, wherein, in an ON state, the second current generating circuit generates, as the second current, current of a magnitude corresponding to the level of the power supply voltage.

4. The signal outputting circuit of claim 1, further comprising a first transistor that turns ON and OFF in accordance with the output signal,
   wherein the second current generating circuit includes a second transistor that is turned ON and OFF in accordance with turning ON and OFF of the first transistor and that outputs the second current.

5. The signal outputting circuit of claim 1, wherein the outputting circuit outputs, as the output signal, a signal of a level that differs from a level of the input signal.

6. A signal outputting circuit comprising:
   a semiconductor chip including an input terminal to which an input signal is inputted; and
   a first resistor element connected to the input terminal,
   wherein the semiconductor chip includes:
   an input line connected to the input terminal,
   a first current generating circuit connected to the input line, the first current generating circuit generating, from the input line, a first current having a magnitude corresponding to a level of a supplied power supply voltage,
   a second current generating circuit connected to the input line, the second current generating circuit generating, from the input line, a second current that turns ON and OFF in accordance with switching of a level of an output signal,
   a second resistor element connected to the input line and connected in series to the first resistor element, and
   an outputting circuit that switches a logic level of the output signal in accordance with a level of voltage generated at the input line.

\* \* \* \* \*